(12) United States Patent
Yen

(10) Patent No.: US 6,838,906 B2
(45) Date of Patent: Jan. 4, 2005

(54) I/O BUFFER WITH VARIABLE CONDUCTIVITY

(75) Inventor: Andrew Yen, Taipei (TW)

(73) Assignee: Via Technologies, Inc. (TW)

( * ) Notice: Subject to any disclaimer, the term of this patent is extended or adjusted under 35 U.S.C. 154(b) by 80 days.

(21) Appl. No.: 10/287,661

(22) Filed: Nov. 5, 2002

(65) Prior Publication Data

US 2003/0090293 A1 May 15, 2003

(30) Foreign Application Priority Data

Nov. 14, 2001 (TW) ........................................ 90128211 A

(51) Int. Cl.[7] .......................................... H03K 19/0175
(52) U.S. Cl. ............................ 326/81; 326/57; 326/112; 326/119; 326/121
(58) Field of Search ........................ 326/56–58, 80–83, 326/86, 112, 119, 121; 327/108, 333

(56) References Cited

U.S. PATENT DOCUMENTS

| | | | | |
|---|---|---|---|---|
| 6,025,738 A | * | 2/2000 | Masleid | 326/83 |
| 6,066,958 A | * | 5/2000 | Taniguchi et al. | 326/27 |
| 6,236,234 B1 | * | 5/2001 | Yagi | 326/80 |
| 6,236,237 B1 | * | 5/2001 | Wong et al. | 326/83 |
| 6,351,148 B1 | * | 2/2002 | Lee | 326/86 |
| 6,535,020 B1 | * | 3/2003 | Yin | 326/83 |
| 6,608,505 B2 | * | 8/2003 | Tsuji | 327/108 |

* cited by examiner

Primary Examiner—Vibol Tan
(74) Attorney, Agent, or Firm—Arent Fox, PLLC

(57) ABSTRACT

A driver structure for an I/O buffer circuit is disclosed. The driver structure includes a pre-push-pull driver and a post-push-pull driver. A delay circuit along is connected in series between the input signals of the pre-push-pull driver and the post-push-pull driver. After a delay time following a transition of the input signal, the circuit operation of the post-push-pull driver is turned off before the amplitude of the output signal reaches its maximum overshooting. This changes the output conductivity to inhibit the overshooting in the output signal, preventing power bounce and ground bounce at the receiving end.

4 Claims, 4 Drawing Sheets

I/O BUFFER WITH VARIABLE CONDUCTIVITY

BACKGROUND OF THE INVENTION

1. Field of Invention

The invention relates to an I/O (Input/Output) buffer circuit. More particular, the invention pertains to an I/O buffer circuit with variable conductivity, which can improve the data integrity and decrease signal wave deformation during SSO (Simultaneous Switching Output).

2. Related Art

With reference to FIG. 1, the conventional I/O buffer circuit is a push-pull driver comprised of a PMOS (P-type Metal Oxide Semiconductor) transistor T1 and an NMOS (N-type Metal Oxide Semiconductor) transistor T2. The transistors T1 and T2 are connected between a work voltage $V_{dd}$ and the ground Gnd in series. The input signal $V_i$ passes through two NOT gates 13 to reach the gates of the transistors T1 and T2. The drains of the transistors T1 and T2 are both connected to the output terminal pad, output signal $V_o$. When the input signal $V_i$ has a Hi voltage, it is inverted by the NOT gate 13 into a Lo voltage. The transistor T1 called a pull-up transistor becomes conductive while the transistor T2 cuts off. The output signal $V_o$ is thus Hi voltage. On the contrary, when the input signal $V_i$ has a Lo voltage, the transistor T2 called a pull-down transistor becomes conductive while the transistor T1 cuts off. Therefore, the output signal $V_o$ is Lo voltage.

In a VLSI (Very Large Scale Integrated) circuit, the so-called SSO refers to the simultaneous transition of the output signals from two or more I/O buffers. When the SSO appears, the internal power Vdd' and the ground Gnd' of the VLSI circuit may produce power bounce and ground bounce. Such noise signal produced by the SSO will cause incorrect judgment on data levels by the receiver. The power bounce and ground bounce often result from simultaneous transitions on a plurality of output signals of the I/O buffers from Hi to Lo or vice versa.

FIG. 2 shows an equivalent circuit of a VLSI internal I/O buffer bus. As shown in the drawing, the internal power Vdd' and the ground Gnd' of the VLSI circuit are connected with an external power $V_{dd}$ and an external ground Gnd through protector inductors $L_1$ and $L_2$, respectively. In the I/O buffer bus, one I/O port D1 is maintained at Hi while another I/O port D2 at Lo. The rest of I/O ports may have Hi level or Lo level. When the SSO occurs, the internal power Vdd' and the ground Gnd' will generate a larger load current i. When the load current flows through the inductors $L_1$ and $L_2$, the outputs Hi level $V_{dd}$ and Lo level Gnd from the I/O ports D1 and D2 become unstable due to power bounce and ground bounce caused by the voltage drops of the inductors $L_1$ and $L_2$, affecting the accuracy of data reception.

Let's further explain the power bounce phenomenon occurring to the I/O port D1 with reference to FIG. 3A. It shows an equivalent circuit of the I/O port D1 in FIG. 2 and the signal waveform at the receiving end. When the input signals of the rest of I/O port bus change from Lo to Hi, the internal power Vdd' of the VLSI circuit has a load current i1 going to the receiving end. This load current produces a voltage drop $L_1(di1/dt)$ on the inductor $L_1$, so that the Hi level $V_{dd}$ of the I/O port D1 produces a maximal undershooting oscillation (as shown on the right-hand side of FIG. 3A). In response to this phenomenon, the voltage $R_A$ at the receiving end also drops. Therefore, the voltage level at the receiving end may be determined incorrectly as Lo instead of Hi. Such incorrect determinations and actions will affect the normal operations of the circuit.

We use FIG. 3B to further explain the ground bounce phenomenon occurring to the I/O port D2. It shows an equivalent circuit of the I/O port D2 in FIG. 2 and the signal waveform at the receiving end. When the input signals of the rest of I/O port bus change from Hi to Lo, the internal ground Gnd' of the VLSI circuit draws a load current i2 from the receiving end. This load current produces a voltage increase $L_2(di2/dt)$ on the inductor $L_2$, making the I/O port D2 outputs a Lo level voltage (as shown on the right-hand side of FIG. 3B). In response to this phenomenon, the voltage $R_B$ at the receiving end produces a bounce. Therefore, the voltage level at the receiving end may be determined incorrectly as Hi instead of Lo. Such incorrect determinations and actions also affect the normal operations of the circuit.

SUMMARY OF THE INVENTION

A objective of the invention provides an I/O buffer circuit with variable conductivity. Through the conductivity change of the buffer circuit, the output signals from the I/O ports to avoid maximal overshooting and ringback oscillations during transitions.

In observation of the unstable phenomena occurred to the receive end during the SSO transitions that may result in incorrect actions of circuit operations, the invention thus improves the I/O buffer driver circuit. The invention uses a delay circuit in combination with a CMOS transistor driver to change the conductivity characteristic of the output signals. When the I/O output signals make transitions, the conductivity of the CMOS transistor first increases. Before the output signal wave reaches its maximum overshooting, the conductivity is gradually lowered. This can effectively inhibit the maximum overshooting phenomena of the output signals. Accordingly, power bounce and ground bounce can be avoided at the receiving end. The invention can further improve the data accuracy and integrity during SSO.

In an embodiment of the invention, the I/O buffer circuit has an output signal that includes a pre-push-pull driver and a post-push-pull driver. In particular, a delay circuit in combination with a simple logic circuit is connected between the pre-push-pull driver and the post-push-pull driver in series. After a delay time following the transition of input signal, the post-push-pull driver operation is shut down before the amplitude of the output signal reaches its maximum overshooting so as to change the conductivity of the output.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
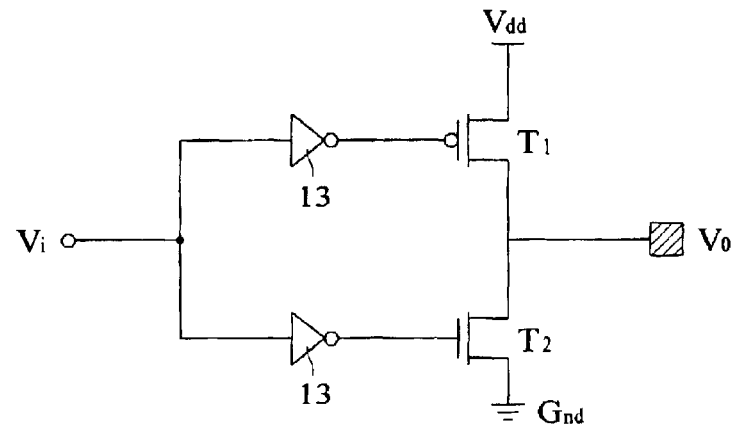
FIG. 1 is a conventional I/O buffer circuit.
Figure 2:
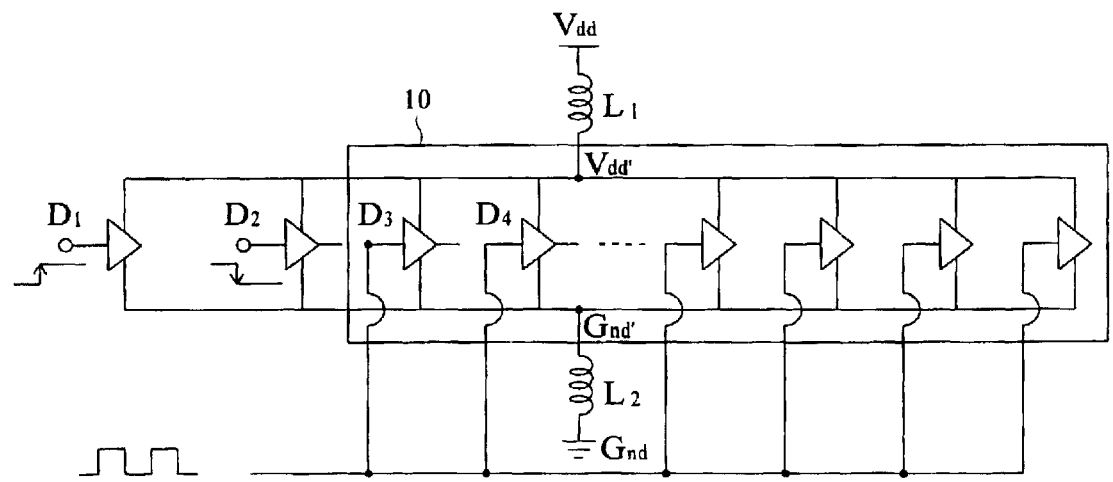
FIG. 2 shows an equivalent circuit of an internal I/O buffer bus of a semiconductor IC.
Figure 3A:
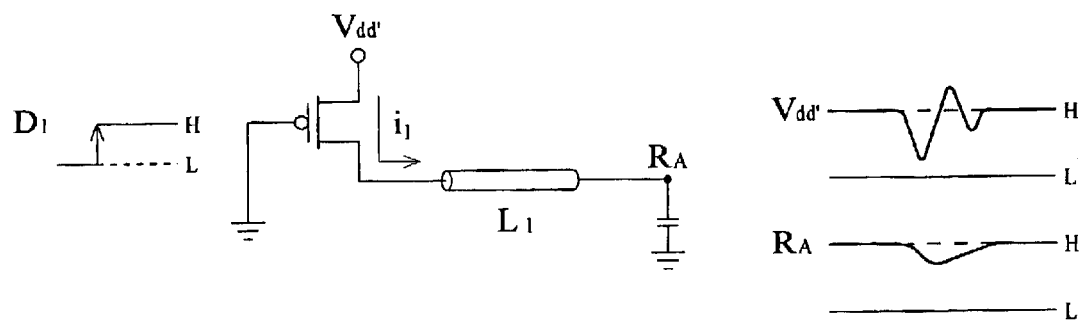
FIG. 3A shows an equivalent circuit of the I/O port D1 in FIG. 2 and the signal waveform at the receiving end.
Figure 3B:
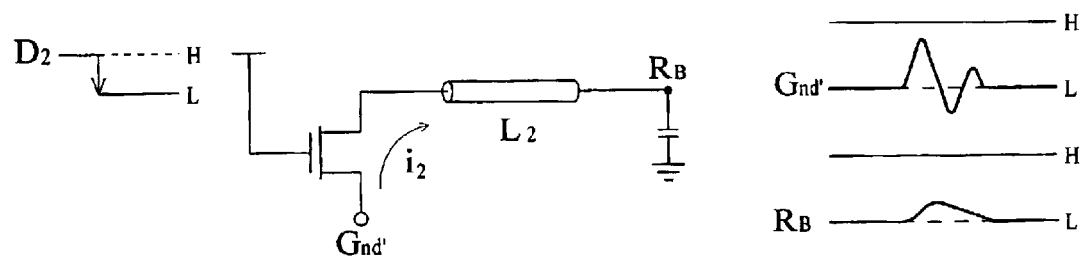
FIG. 3B shows an equivalent circuit of the I/O port D2 in FIG. 2 and the signal waveform at the receiving end.
Figure 4:
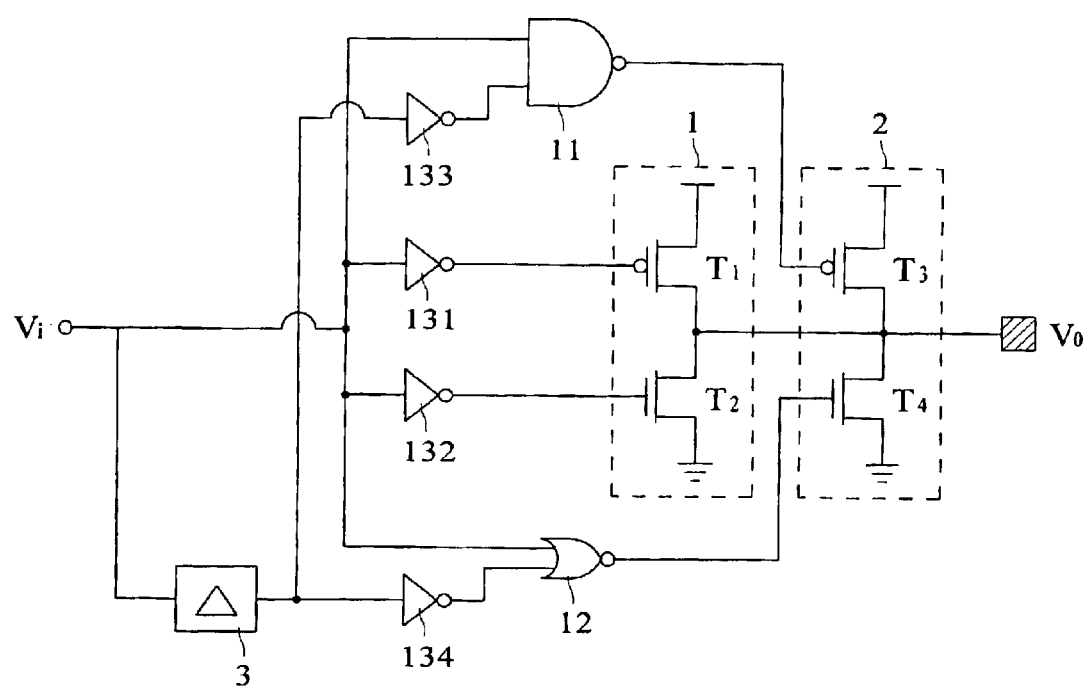
FIG. 4 is a circuit diagram of the disclosed I/O buffer with variable conductivity of the present invention.

With reference to FIG. 4, the I/O buffer with variable conductivity of the present invention includes a pre-push-pull driver 1 and a post-push-pull driver 2. The input signals of pre-push-pull driver 1 and the post-push-pull driver 2 are connected with a delay circuit 3 in series, so that the two input signals have a delayed phase difference. The pre-push-pull driver 1 and post-push-pull driver 2 drive the output signal $V_o$ in the delayed phase difference to provide the desired variable conductivity.

When the input signal $V_i$ makes a transition, the pre-push-pull drive 1 and post-push-pull driver 2 simultaneously drive the output signal $V_o$ to provide larger conductivity. Due to the effect of the delay circuit 3, the post-push-pull driver 2 stops driving after a delay time following the transition of the input signal $V_i$. The conductivity of the output signal $V_o$ is thus changed to provide a smaller conductivity, inhibiting the increase of the load current i and preventing the overshooting of the output signal $V_o$. Therefore, when the I/O buffer of the present invention has SSO, no power bounce and ground bounce will happen to the output signal $V_o$ at the receiving end and the data accuracy and integrity during SSO can be improved.

The I/O buffer with variable conductivity of the present invention utilizes a delay circuit 3, logic gates NAND 11, NOR 12, and four NOT gates (131,132,133,134). The I/O buffer makes the post-push-pull driver 2 conductive during the transition of the input signal $V_i$. After a delay time (determined by the delay circuit 3), the post-push-pull driver 2 stops driving. The operation of the circuit is described in the following paragraphs.

When the input signal $V_i$ changes from Lo to Hi and is inverted by the NOT 131 and 132, the pull-up transistor T1 of the pre-push-pull driver 1 is conductive while the pull-down transistor T2 being cut off. At the same time, the output signal of the delay circuit 3 has not made a transition and is kept at Lo due to the delay effect. The output signal of the delay circuit 3 passes through the NOT 133 and the NAND 11 to reach the gate of the transistor T3. The pull-up transistor T3 of the post-push-pull driver 2 becomes conductive. The output signal of the delay circuit 3 passes through the NOT 134 and the NOR 12 to reach the gate of the transistor T4. the pull-down transistor T4 of the post-push-pull driver 2 is cut off. Therefore, when the input signal $V_i$ changes from Lo to Hi, the pull-up transistors T1, T3 of the pre-push-pull drivers 1 and post-push-pull drivers 2 become conductive, providing a load current i with desired pull-up conductivity to the output signal $V_o$.

After a delay time and before the load current i increases to its maximum overshooting, the output signal of the delay circuit 3 changes from Lo to Hi. After the output signal of the delay circuit 3 passes through the NOT 133 and the NAND 11, the pull-up transistor T3 of the post-push-pull driver 2 is cut off. After the output signal of the delay circuit 3 passes through the NOT 134 and the NOR 12, the pull-down transistor T4 of the post-push-pull driver 2 is kept off. Therefore, the pull-up conductivity of the output signal $V_o$ is changed so that the pull-up conductivity drops. This thus prevents the load current i from maximal overshooting and ringback oscillations.

When the input signal $V_i$ changes from Hi to Lo and is inverted by the NOT 131 and 132, the pull-up transistor T1 of the pre-push-pull driver 1 is cut off while the pull-down transistor T2 being conductive. At the same time, the output signal of the delay circuit 3 has not made a transition and is kept at Hi due to the delay effect. After the output signal of the delay circuit 3 passes through the NOT 134 and the NOR 12, the pull-down transistor T4 of the post-push-pull driver 2 becomes conductive. After the output signal of the delay circuit 3 passes through the NOT 133 and the NAND 11, the pull-up transistor T3 of the post-push-pull driver 2 is cut off. Therefore, when the input signal $V_i$ changes from Hi to Lo, the pull-down transistors T2, T4 of the pre-push-pull driver 1 and post-push-pull driver 2 become conductive, providing a load current i with pull-up conductivity to the output signal $V_o$.

After a delay time and before the load current i increases to its maximum overshooting, the output signal of the delay circuit 3 changes from Hi to Lo. After the output signal of the delay circuit 3 passes through the NOT 134 and the NOR 12, the pull-down transistor T4 of the post-push-pull driver 2 is cut off. After the output signal of the delay circuit 3 passes through the NOT 133 and the NAND 11, the pull-up transistor T3 of the post-push-pull driver 2 is kept off. Therefore, the pull-down conductivity of the output signal $V_o$ is changed so that the pull-down conductivity drops. This thus prevents the load current i from maximal undershooting and ringback oscillations.

Figure 5:
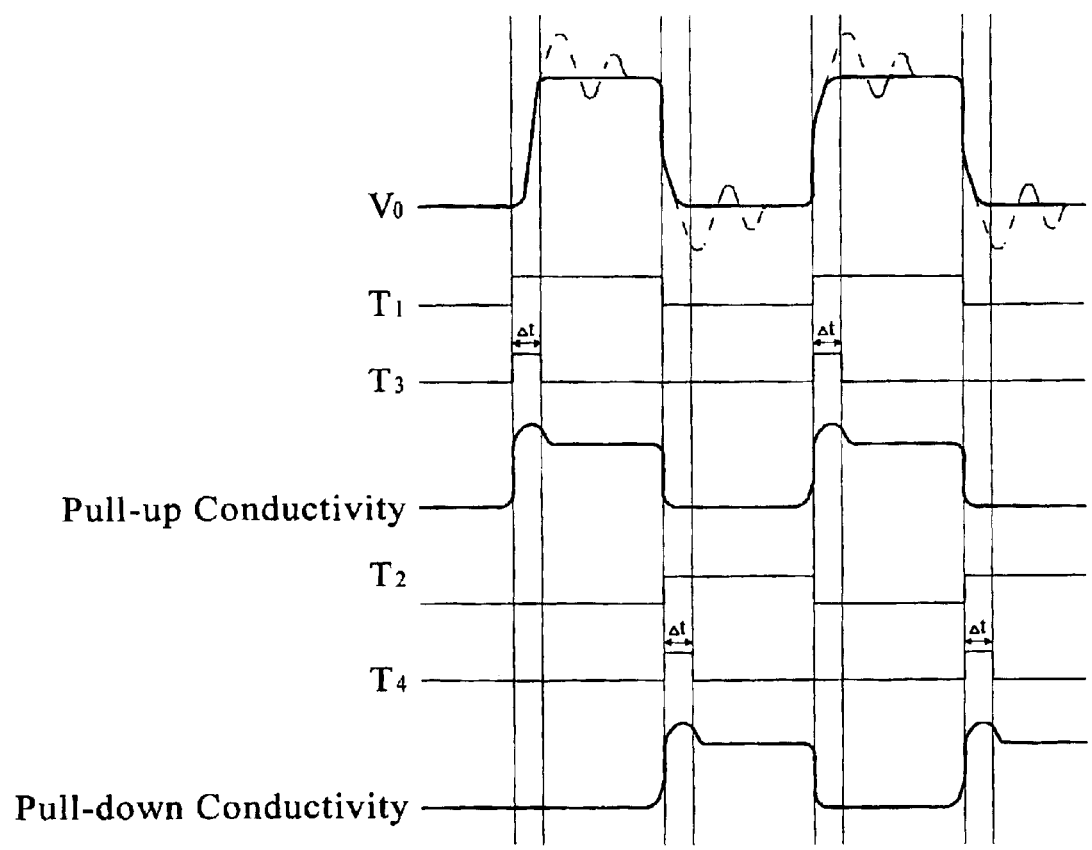
FIG. 5 shows the signal waveforms at various points in FIG. 4.

In FIG. 5, thin lines are waveforms on various signals in the prior art. The output signal $V_o$ depicted by thin line has the problems of overshooting and ringbacks. Thick lines are produced by the disclosed circuit of the present invention. the output signal $V_o$ depicted by thick line does not have either overshooting or ringbacks. This is because the invention can effectively inhibit the overshooting and ringbacks due to SSO.

With reference to FIG. 4, when the input signal $V_i$ changes from Lo to Hi, the input signal of the post-push-pull driver 2 is delayed for a period due to the delay circuit. The output signal of the delay circuit goes through some simple logic operations, turning on the transistor T1 while turning off the transistors T2 and T4. The transistor T3 is on for a period of time $\Delta t$ and then off, so that the load current i changes the pull-up conductivity thereof due to the transistor T3 being cut off. The load current i is thus inhibited without producing overshooting. The pull-up conductivity in the output signal $V_o$ then slowly drops. The pull-up transistor T1 of the pre-push-pull driver 1 takes over to supply the conductivity of the output signal, so that the I/O buffer bus does not cause power bounce at the receiving end during SSO.

When the input signal $V_i$ changes from Hi to Lo, the input signal of the post-push-pull driver 2 is delayed for a period due to the delay circuit. The output signal of the delay circuit goes through some simple logic operations, turning on the transistor T2 while turning off the transistors T1 and T3. The transistor T4 is on for a period of time $\Delta t$ and then off, so that the load current i changes its pull-down conductivity due to the transistor T4 being cut off. The load current i is thus inhibited without producing undershooting. The pull-up conductivity in the output signal $V_o$ then slowly increases. The pull-down transistor T2 of the pre-push-pull driver 1 takes over to supply the conductivity of the output signal, so that the I/O buffer bus does not cause ground bounce at the receiving end during SSO.

EFFECTS OF THE INVENTION

The invention provides an I/O buffer with variable conductivity. Using a driver structure with the combination of a delay circuit and CMOS transistors, the conductivity of the output signal can be changed to avoid signal bounces and ringbacks. Therefore, the disclosed driver can be widely used in the I/O buffers for VLSI circuits to prevent unstable signal outputs caused by transitions during SSO.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements. For example, an I/O buffer circuit of the present invention, comprising: a pre-driver, at least one post-driver, and a delay circuit, wherein the delay circuit is connected in series between the input signals of the pre-driver and the post-drivers to turn off the operation of the post-driver after the pre-driver and the post-driver work for a delay time.

What is claimed is:

1. An I/O buffer circuit having an input signal and an output signal, comprising:

a pre-driver, consisting of PMOS and NMOS transistors;

at least one post-driver, consisting of PMOS and NMOS transistors;

a delay circuit for delaying the input signal with a delay time; and a logic circuit, at least including first, second, third and fourth NOT gates, one NAND gate and one NOR gate, the first NOT gate connected in series between the input signal and the PMOS transistor of the pre-driver, the second NOT gate connected in series between the input signal and the NMOS transistor of the pre-driver, the third NOT gate connected in series between the input signal with the delay time and the NAND gate and the fourth NOT gate connected in series between the input signal with the delay time and the NOR gate, the output of the NAND gate connected to the PMOS transistor of the post-driver and the output of the NOR gate connected to the NMOS transistor of the post-driver; where the combination of the delay circuit and the logic circuit turns off the post-driver after the pre-driver and the post-driver work for the delay time.

2. The buffer circuit of claim 1, wherein said pre-driver and the post-driver are push-pull drivers.

3. The buffer circuit of claim 1, wherein said delay circuit turns off the operation of the post-driver after the delay time following a transition of the input signal, thus changing the conductivity of a circuit output.

4. The buffer circuit of claim 3, wherein the delay circuit turns off the operation of the post-driver after the delay time following the transition and before the amplitude of a output signal reaches a maximum overshooting, thus changing the conductivity of the circuit output.

\* \* \* \* \*